(12) United States Patent
Gulabal et al.

(10) Patent No.: US 11,725,285 B2
(45) Date of Patent: Aug. 15, 2023

(54) PREVENTING DEPOSITION ON PEDESTAL IN SEMICONDUCTOR SUBSTRATE PROCESSING

(71) Applicant: LAM RESEARCH CORPORATION, Fremont, CA (US)

(72) Inventors: Vinayakaraddy Gulabal, Yadgir (IN); Ravi Vellanki, San Jose, CA (US); Gary B. Lind, Penn Valley, CA (US); Michael Rumer, Santa Clara, CA (US); Manjunath Satyadevan, Bangalore (IN)

(73) Assignee: Lam Research Corporation, Fremont, CA (US)

( * ) Notice: Subject to any disclaimer, the term of this patent is extended or adjusted under 35 U.S.C. 154(b) by 179 days.

(21) Appl. No.: 17/262,855

(22) PCT Filed: Jul. 25, 2019

(86) PCT No.: PCT/US2019/043464
§ 371 (c)(1),
(2) Date: Jan. 25, 2021

(87) PCT Pub. No.: WO2020/028145
PCT Pub. Date: Feb. 6, 2020

(65) Prior Publication Data
US 2021/0230749 A1    Jul. 29, 2021

Related U.S. Application Data

(60) Provisional application No. 62/832,952, filed on Apr. 12, 2019, provisional application No. 62/712,436, filed on Jul. 31, 2018.

(51) Int. Cl.
*C23C 16/458* (2006.01)
*C23C 16/02* (2006.01)
*C23C 16/455* (2006.01)

(52) U.S. Cl.
CPC ...... *C23C 16/4583* (2013.01); *C23C 16/0209* (2013.01); *C23C 16/0254* (2013.01); *C23C 16/45525* (2013.01)

(58) Field of Classification Search
CPC ......... H01L 21/67109; H01L 21/68792; C23C 16/4583
See application file for complete search history.

(56) References Cited

U.S. PATENT DOCUMENTS

| | | | |
|---|---|---|---|
| 5,556,476 A | * | 9/1996 | Lei ...................... C23C 16/4585 118/728 |
| 2009/0078694 A1 | | 3/2009 | Hayashi |

(Continued)

FOREIGN PATENT DOCUMENTS

| | | |
|---|---|---|
| JP | 2003234298 A | 8/2003 |
| JP | 2013131555 A | 7/2013 |

OTHER PUBLICATIONS

International Search Report and Written Opinion of the ISA issued in PCT/US2019/043464, dated Nov. 11, 2019; ISA/KR.

*Primary Examiner* — Joseph A Miller, Jr.

(57) ABSTRACT

A heat shield structure for a substrate support in a substrate processing system includes an outer shield configured to surround a stem of the substrate support. The outer shield is further configured to define an inner volume between the outer shield and an upper portion of the stem and a lower surface of the substrate support and a vertical channel between the outer shield and a lower portion of the stem of the substrate support. The outer shield includes a cylindrical portion, a first lateral portion extending radially outward from the cylindrical portion, an angled portion extending radially outward and upward from the first lateral portion, and a second lateral portion extending radially outward from the angled portion.

10 Claims, 8 Drawing Sheets

(56) References Cited

U.S. PATENT DOCUMENTS

| | | | |
|---|---|---|---|
| 2010/0163183 A1 | 7/2010 | Tanaka et al. | |
| 2010/0317197 A1* | 12/2010 | Lind | C23C 16/4401 |
| | | | 438/758 |
| 2017/0275753 A1 | 9/2017 | Baluja et al. | |

* cited by examiner

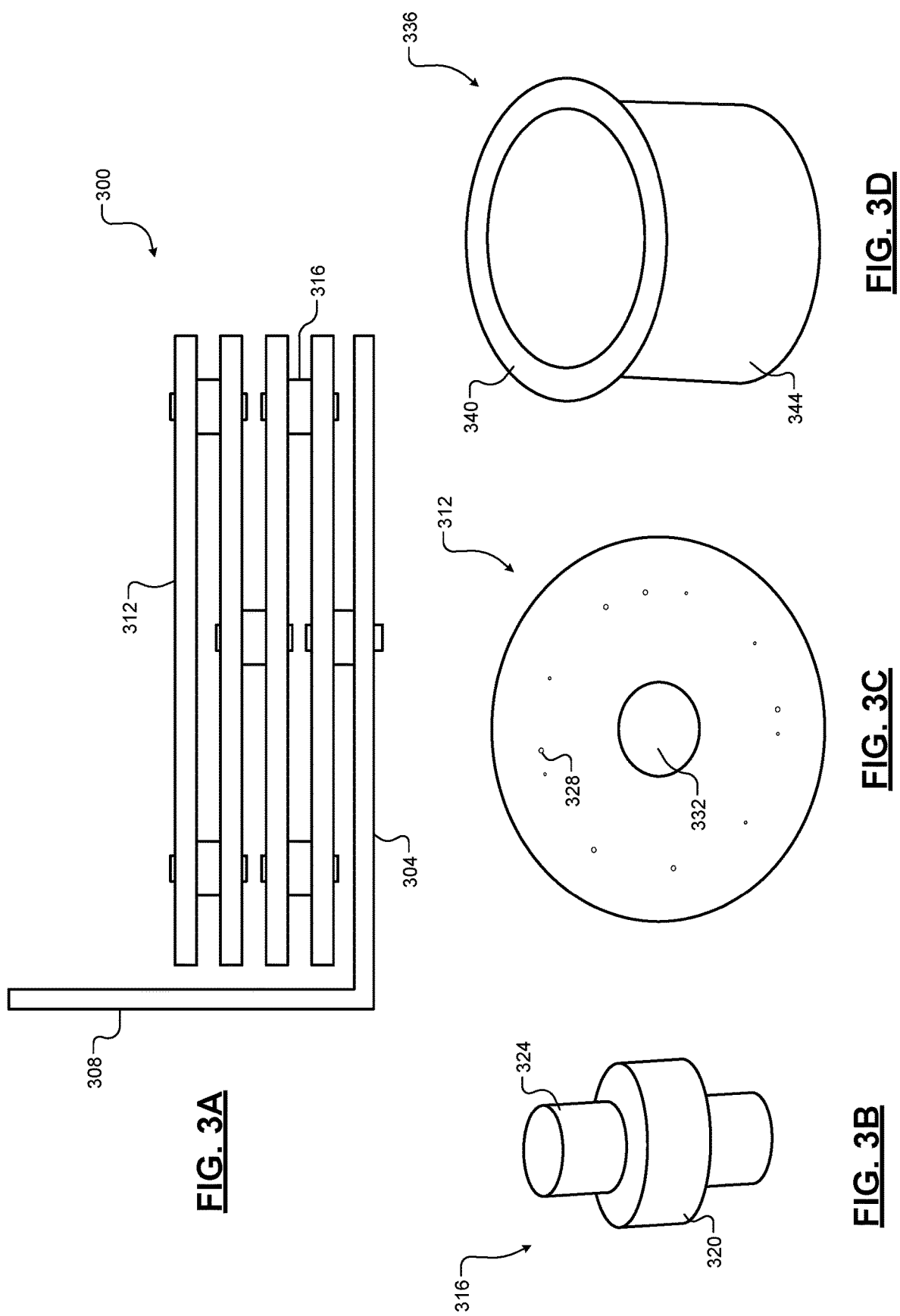

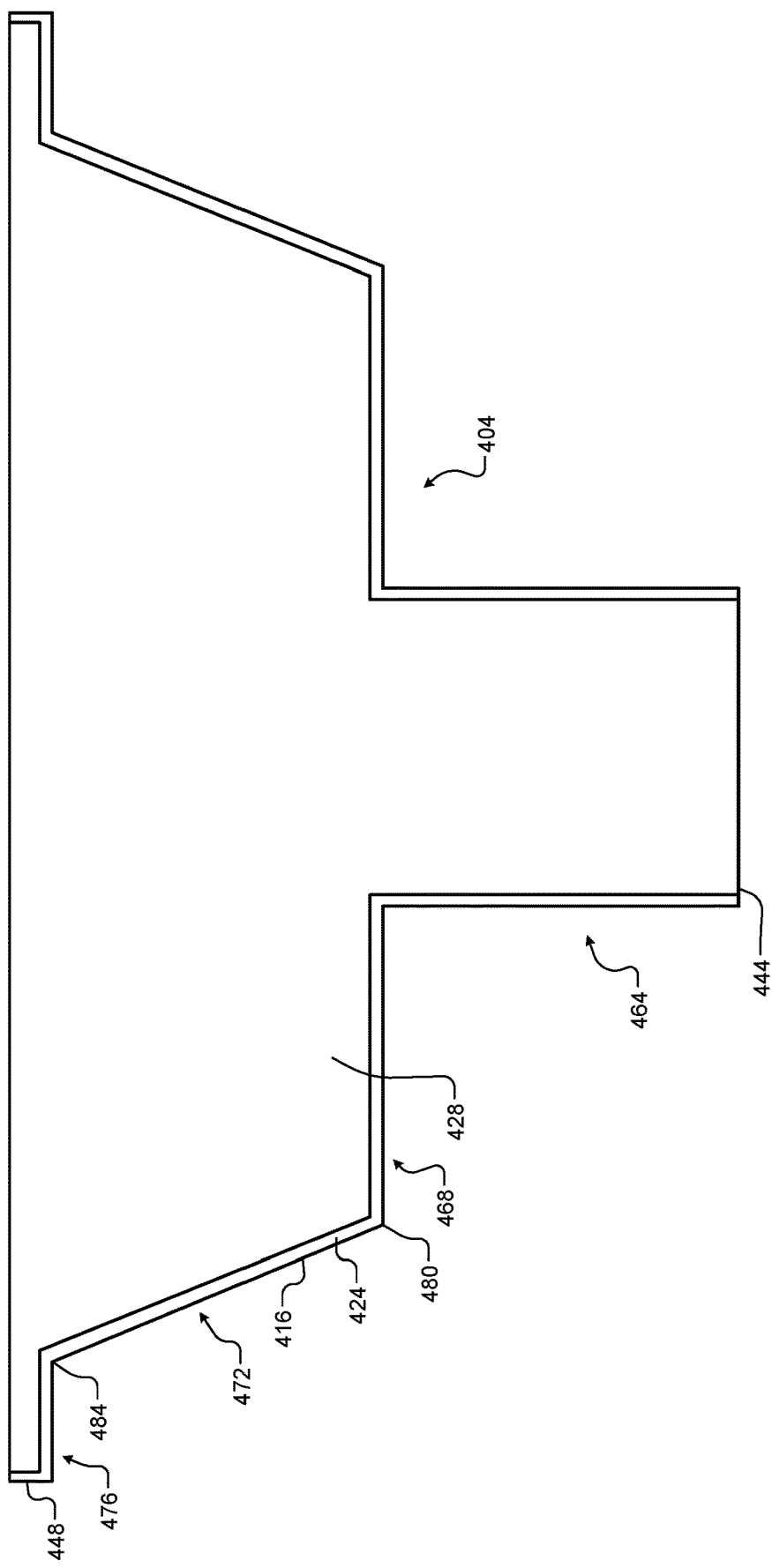

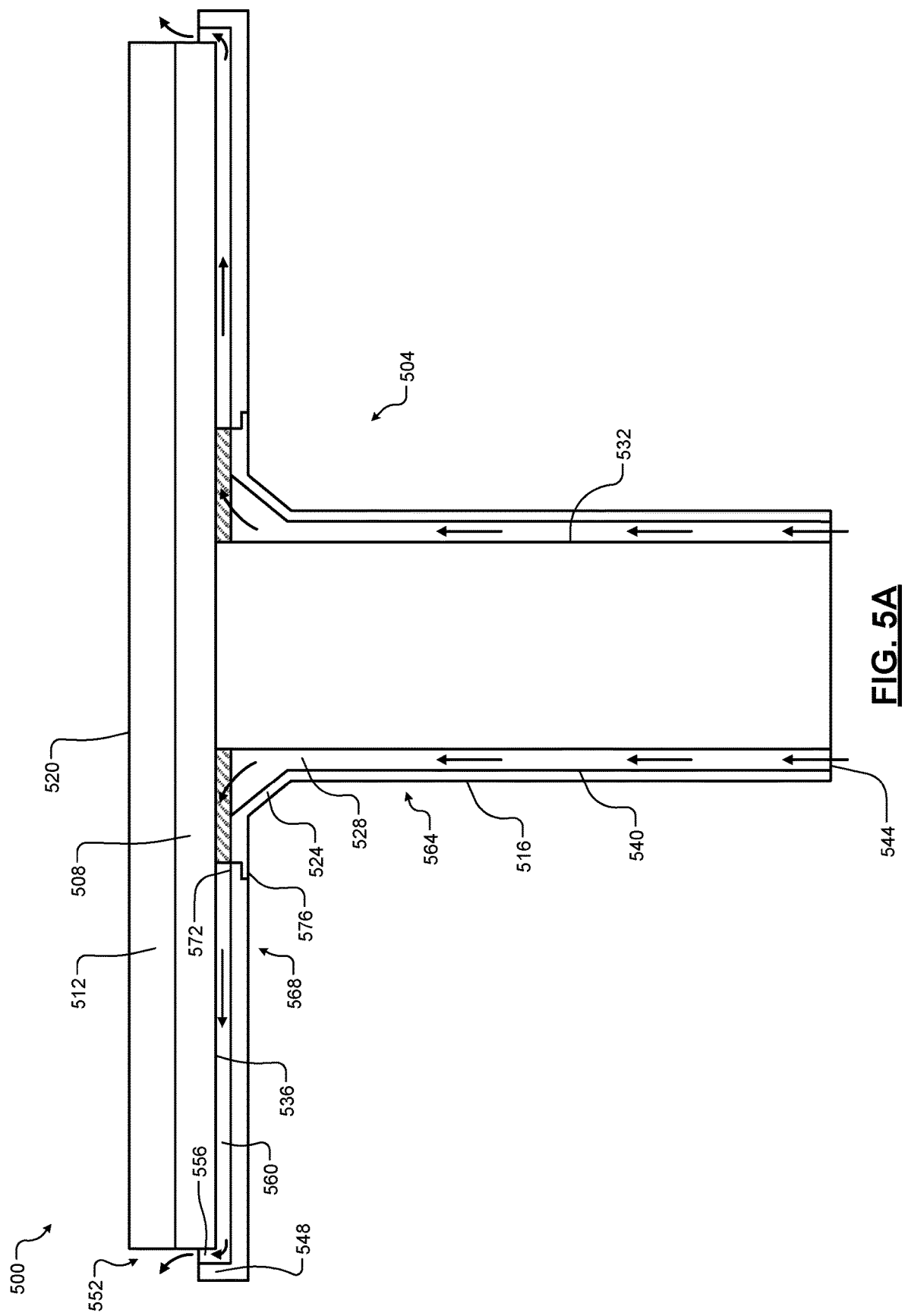

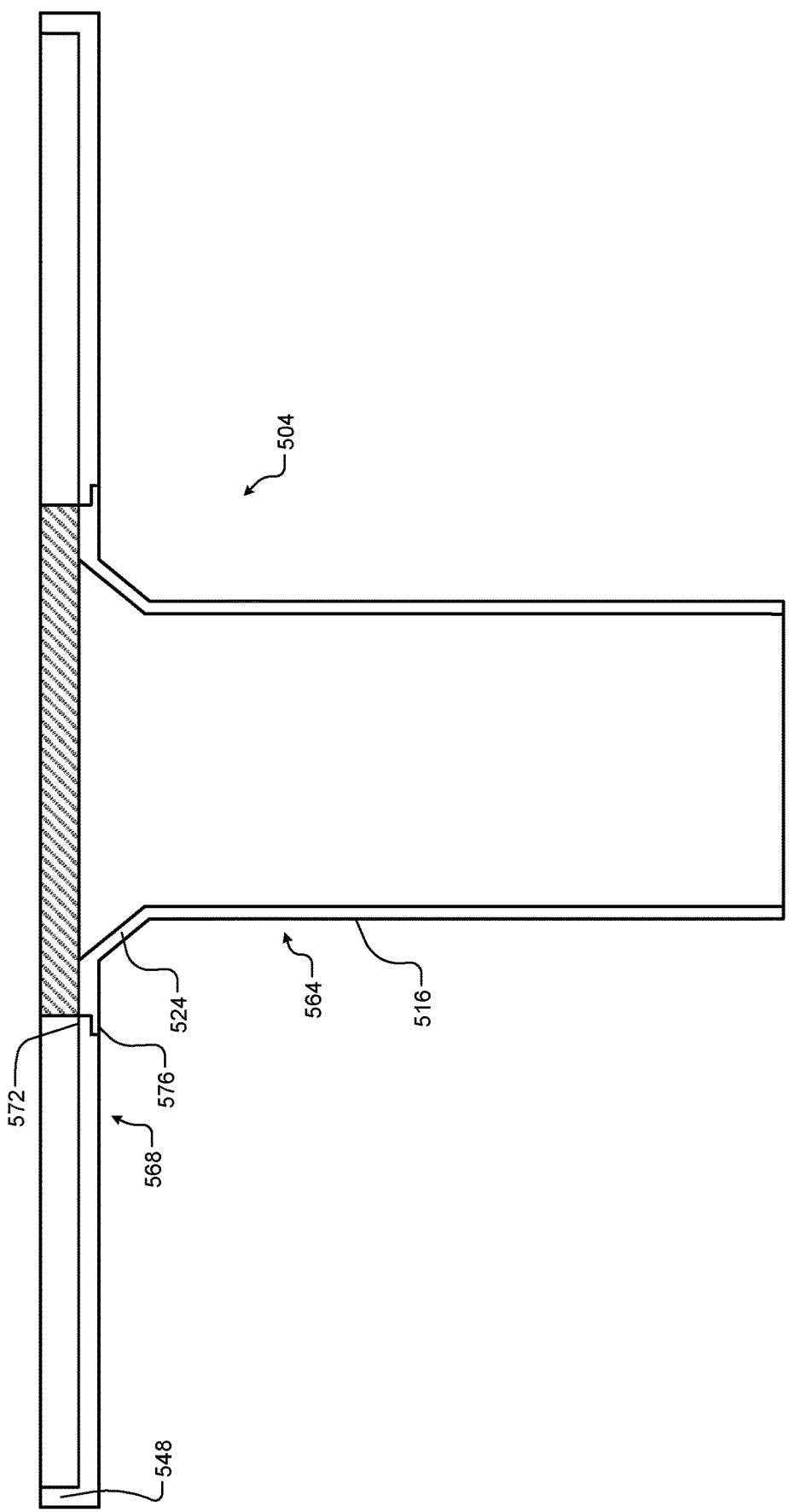

PREVENTING DEPOSITION ON PEDESTAL IN SEMICONDUCTOR SUBSTRATE PROCESSING

CROSS-REFERENCE TO RELATED APPLICATIONS

This application is a U.S. National Phase Application under 35 U.S.C. 371 of International Application No. PCT/US2019/043464, filed on Jul. 25, 2019, which claims the benefit of U.S. Provisional Application No. 62/712,436, filed on Jul. 31, 2018, and U.S. Provisional Application No. 62/832,952, filed on Apr. 12, 2019. The entire disclosures of the applications referenced above are incorporated herein by reference.

FIELD

The present disclosure relates to substrate processing, and more particularly to preventing deposition on a pedestal used in semiconductor substrate deposition processes.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to perform treatments such as deposition and etching of film on substrates such as semiconductor wafers. For example, deposition may be performed to deposit conductive film, dielectric film or other types of film using chemical vapor deposition (CVD), atomic layer deposition (ALD), and/or other deposition processes. During deposition, the substrate is arranged on a substrate support and one or more precursor gases may be supplied to a processing chamber during one or more process steps. Plasma may be used to initiate chemical reactions. After deposition is performed, the process gases are evacuated and the substrate is removed from the processing chamber.

BRIEF DESCRIPTION OF THE DRAWINGS

The present disclosure will become more fully understood from the detailed description and the accompanying drawings, wherein:

FIG. 3A shows an example arrangement of heat shield plates according to the present disclosure;

FIG. 3B is an example insulator pin for supporting the heat shield plates according to the present disclosure;

FIG. 3C is an example heat shield plate according to the present disclosure;

FIG. 3D is an example radial inner shield according to the present disclosure;

FIG. 4B is another example of the heat shield structure of FIG. 4A according to the present disclosure;

FIG. 5A is a pedestal including another example heat shield structure according to the present disclosure; and FIG. 5B is another example of the heat shield structure of FIG. 5A according to the present disclosure.

In the drawings, reference numbers may be reused to identify similar and/or identical elements.

SUMMARY

Figure 1:
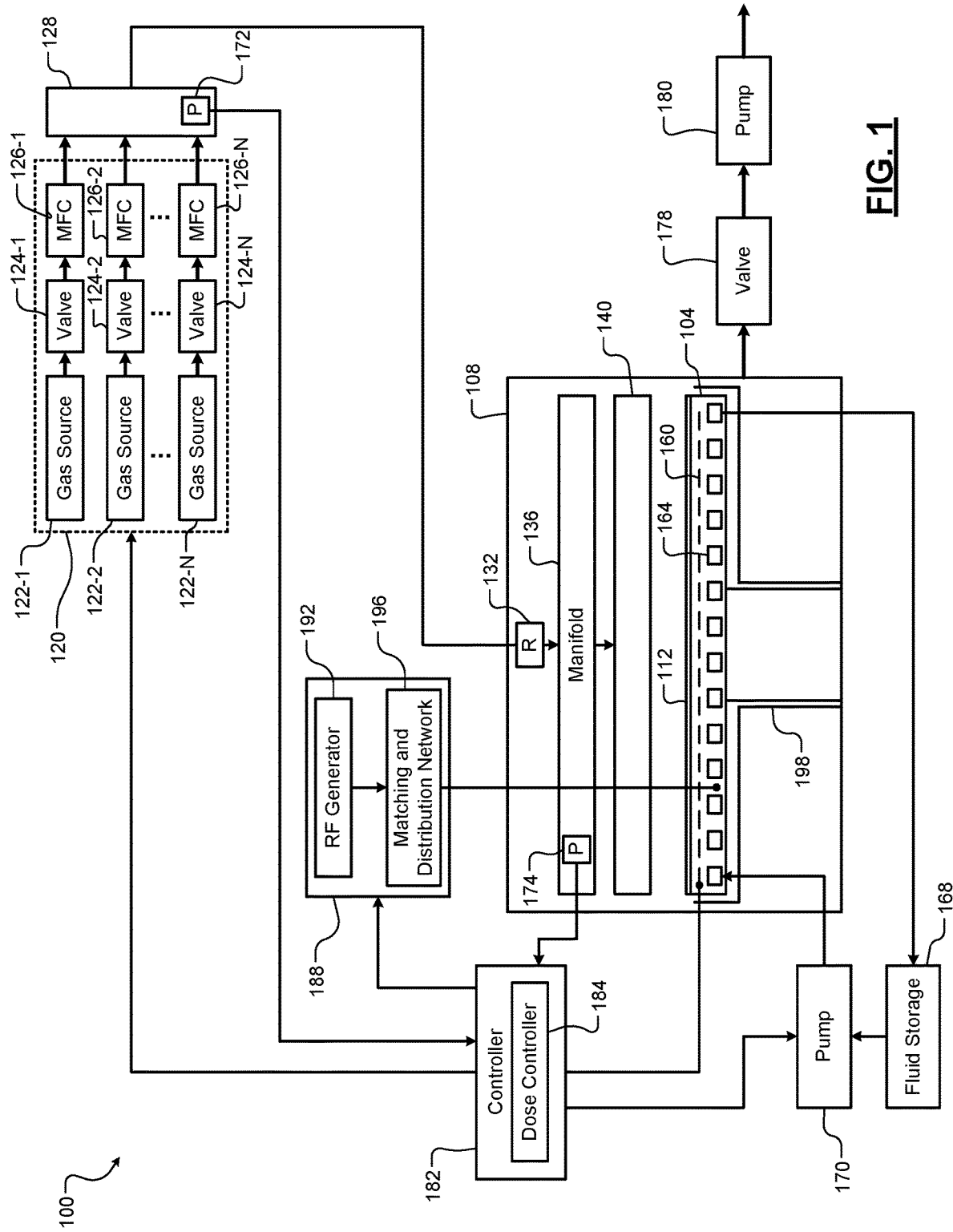
FIG. 1 is a functional block diagram of an example of a substrate processing system according to the present disclosure.

A heat shield structure for a substrate support in a substrate processing system includes an outer shield configured to surround a stem of the substrate support. The outer shield is further configured to define an inner volume between the outer shield and the stem of the substrate support and the outer shield and a lower surface of the substrate support. At least one heat shield plate is configured to be arranged below the substrate support in the inner volume between the outer shield and the lower surface of the substrate support. An edge guard extends upward from the outer shield and is configured to surround an outer perimeter of the substrate support and define a gap between the edge guard and the substrate support.

In other features, the at least one heat shield plate includes a plurality of heat shield plates spaced apart within the inner volume between the outer shield and the lower surface of the substrate support. The heat shield structure further includes a plurality of insulator pins arranged between adjacent ones of the heat shield plates. The heat shield structure further includes an inner shield arranged between the outer shield and the stem. The inner shield extends downward from the at least one heat shield plate and defines a second inner volume between the inner shield and the stem.

In other features, the outer shield is not in direct contact with either one of the stem and the lower surface of the substrate support. The heat shield plate is not in direct contact with any one of the lower surface of the substrate support, the stem of the substrate support, and the outer shield. A substrate support includes the heat shield structure. The substrate support corresponds to a pedestal configured to support a substrate during at least one of chemical vapor deposition and atomic layer deposition. A system includes the heat shield structure and a gas source configured to flow a purge gas into the inner volume.

A heat shield structure for a substrate support in a substrate processing system includes an outer shield configured to surround a stem of the substrate support. The outer shield is further configured to define an inner volume between the outer shield and an upper portion of the stem and a lower surface of the substrate support and a vertical channel between the outer shield and a lower portion of the stem of the substrate support. The outer shield includes a cylindrical portion, a first lateral portion extending radially outward from the cylindrical portion, an angled portion extending radially outward and upward from the first lateral portion, and a second lateral portion extending radially outward from the angled portion.

In other features, the heat shield structure further includes an edge guard extending upward from the second lateral portion of the outer shield. The edge guard is configured to surround an outer perimeter of the substrate support and define a gap between the edge guard and the substrate support. The vertical channel is annular. A length of the first lateral portion is between 50% and 70% of a distance between the stem of the substrate support and the outer perimeter of the substrate support. A length of the second lateral portion is at least 10% of and less than 25% of a distance between the stem of the substrate support and the outer perimeter of the substrate support. An angle of the angled portion relative to the first lateral portion is between 95 and 135 degrees.

In other features, the second lateral portion defines a lateral channel between the second lateral portion and the lower surface of the substrate support. A width of the lateral channel is between 1 and 10 mm. A width of the gap is between 1 and 10 mm. The outer shield is not in direct contact with either one of the stem and the lower surface of the substrate support. A substrate support includes the heat shield structure. The substrate support corresponds to a pedestal configured to support a substrate during at least one of chemical vapor deposition and atomic layer deposition. A system includes the heat shield structure and a gas source configured to flow a purge gas into the inner volume via the vertical channel.

Further areas of applicability of the present disclosure will become apparent from the detailed description, the claims and the drawings. The detailed description and specific examples are intended for purposes of illustration only and are not intended to limit the scope of the disclosure.

DETAILED DESCRIPTION

During deposition using chemical vapor deposition (CVD), atomic layer deposition (ALD), and/or other deposition processes, a conductive film, dielectric film, or other type of film is deposited on a substrate. While film is deposited on the substrate, material may also be deposited on other components located in the processing chamber, such as a pedestal arranged to support the substrate. Over time, residual film builds up on these components and needs to be removed to prevent particle contamination, mechanical deformation, and/or substrate defects. A chamber cleaning process is periodically performed to remove the residual film from the components in the processing chamber. For example, a fixed time cleaning process may be used.

In some examples (e.g., including, but not limited to, substrate processing systems including active pedestals configured to be moved upward and downward relative to the processing chamber to tune deposition performance), surfaces of various structures within the substrate processing system may be more susceptible to deposition. For example, increased temperatures may be associated with an increase in a rate of deposition of tungsten. Accordingly, in examples where the pedestal is heated, an increased amount of tungsten may be deposited on surfaces of the pedestal during deposition steps. In these examples, fixed time cleaning processes may not be sufficient to thoroughly remove the deposited tungsten or other materials from the surfaces of the pedestal. Further, the increased deposition causes deformation of a stem of the pedestal, which may lead to failure of the pedestal.

In some deposition systems, a deposition rate of material below the pedestal (e.g., on lower surfaces of the pedestal, surfaces of a stem, etc.) may be greater than a deposition rate of material above the pedestal (e.g., on upper surfaces of the pedestal, on the substrate, etc.). For example, in a low fluorine tungsten (LFW) ALD system CVD occurs in a region of the processing chamber below the pedestal during the LFW ALD process. A deposition rate of the CVD below the pedestal is significantly greater (e.g., 10 times or more) than a deposition rate of the ALD above the pedestal. Accordingly, the CVD causes large amounts of tungsten to be deposited on the lower surfaces of the pedestal during the LFW ALD process.

Systems and methods according to the principles of the present disclosure reduce deposition of tungsten and other materials on surfaces of the pedestal and, accordingly, reduce cleaning times. For example, a pedestal according to the present disclosure includes a heat shield structure arranged around the pedestal. In one example, the heat shield structure includes an outer shield, a radial inner shield, and one or more heat shield plates arranged between the outer shield and a lower surface of the pedestal. In another example, the heat shield structure includes only a single-piece outer shield. An inner volume between the outer shield and the stem may be purged with an inert gas (e.g., Argon). The heat shield structure reduces a temperature on outer surfaces of the pedestal. The reduced temperature and the purging of the inner volume reduce deposition of tungsten and other materials on the pedestal as described below in more detail. The reduced deposition correspondingly reduces clean time (e.g., by 65% relative to the clean time for process chambers that do not include the heat shield structure according to the present disclosure), thereby increasing substrate throughput (e.g., by 10%). Further, a lifetime of the pedestal may be increased (e.g., up to two years). Power consumption associated with maintaining the pedestal at a desired temperature may also be reduced (e.g., by up to 42%).

Referring now to FIG. 1, an example of a substrate processing system 100 including a substrate support (e.g., a pedestal configured for CVD and/or ALD deposition) 104 according to the present disclosure is shown. The substrate support 104 is arranged within a processing chamber 108. A substrate 112 is arranged on the substrate support 104 during processing. For example, deposition is performed on the substrate 112. The substrate 112 is removed and one or more additional substrates are treated. Over time, residual film or other material, such as tungsten, builds up on components such as side walls of the processing chamber 108, surfaces of the substrate support 104, etc. Cleaning is performed periodically to remove residual film or other material deposited on surfaces within the processing chamber 108.

A gas delivery system 120 includes gas sources 122-1, 122-2, ..., and 122-N (collectively gas sources 122) that are connected to valves 124-1, 124-2, ..., and 124-N (collectively valves 124) and mass flow controllers 126-1, 126-2, ..., and 126-N (collectively MFCs 126). The MFCs 126 control flow of gases from the gas sources 122 to a manifold 128 where the gases mix. An output of the manifold 128 is supplied via an optional pressure regulator 132 to a manifold 136. An output of the manifold 136 is input to a gas distribution device such as a multi-injector showerhead 140. While the manifold 128 and 136 are shown, a single manifold can be used.

In some examples, a temperature of the substrate support 104 may be controlled using resistive heaters 160. The substrate support 104 may include coolant channels 164. Cooling fluid is supplied to the coolant channels 164 from a fluid storage 168 and a pump 170. Pressure sensors 172, 174 may be arranged in the manifold 128 or the manifold 136, respectively, to measure pressure. A valve 178 and a pump 180 may be used to evacuate reactants from the processing chamber 108 and/or to control pressure within the processing chamber 108.

A controller 182 includes a dose controller 184 that controls dosing provided by the multi-injector showerhead 140. The controller 182 also controls gas delivery from the gas delivery system 120. The controller 182 controls pressure in the processing chamber and/or evacuation of reactants using the valve 178 and the pump 180. The controller 182 controls the temperature of the substrate support 104 and the substrate 112 based upon temperature feedback (e.g., from sensors (not shown) in the substrate support and/or sensors (not shown) measuring coolant temperature).

In some examples, the substrate processing system 100 may be configured to perform etching on the substrate 112 within the same processing chamber 108. Accordingly, the substrate processing system 100 may include an RF generating system 188 configured to generate and provide RF power (e.g., as a voltage source, current source, etc.) to one of a lower electrode (e.g., a baseplate of the substrate support 104, as shown) and an upper electrode (e.g., the showerhead 140). For example purposes only, the output of the RF generating system 188 will be described herein as an RF voltage. The other one of the lower electrode and the upper electrode may be DC grounded, AC grounded or floating. For example only, the RF generating system 188 may include an RF generator 192 configured to generate the RF voltage that is fed by a matching and distribution network 196 to generate plasma within the processing chamber 108 to etch the substrate 112. In other examples, the plasma may be generated inductively or remotely. Although, as shown for example purposes, the RF generating system 188 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

The substrate support 104 according to the present disclosure includes a heat shield structure 198. The heat shield structure 198 reduces deposition of tungsten and other materials on the surfaces of the substrate support 104 as described below in more detail. In some examples of the substrate processing system 100, the substrate support 104 may be configured to be moved upward and downward within the processing chamber 108 to tune deposition parameters during processing. In these examples, the heat shield structure 198 may be configured for upward and downward movement in an analogous manner to maintain the position of the heat shield structure 198 relative to the substrate support 104.

Figure 2A:
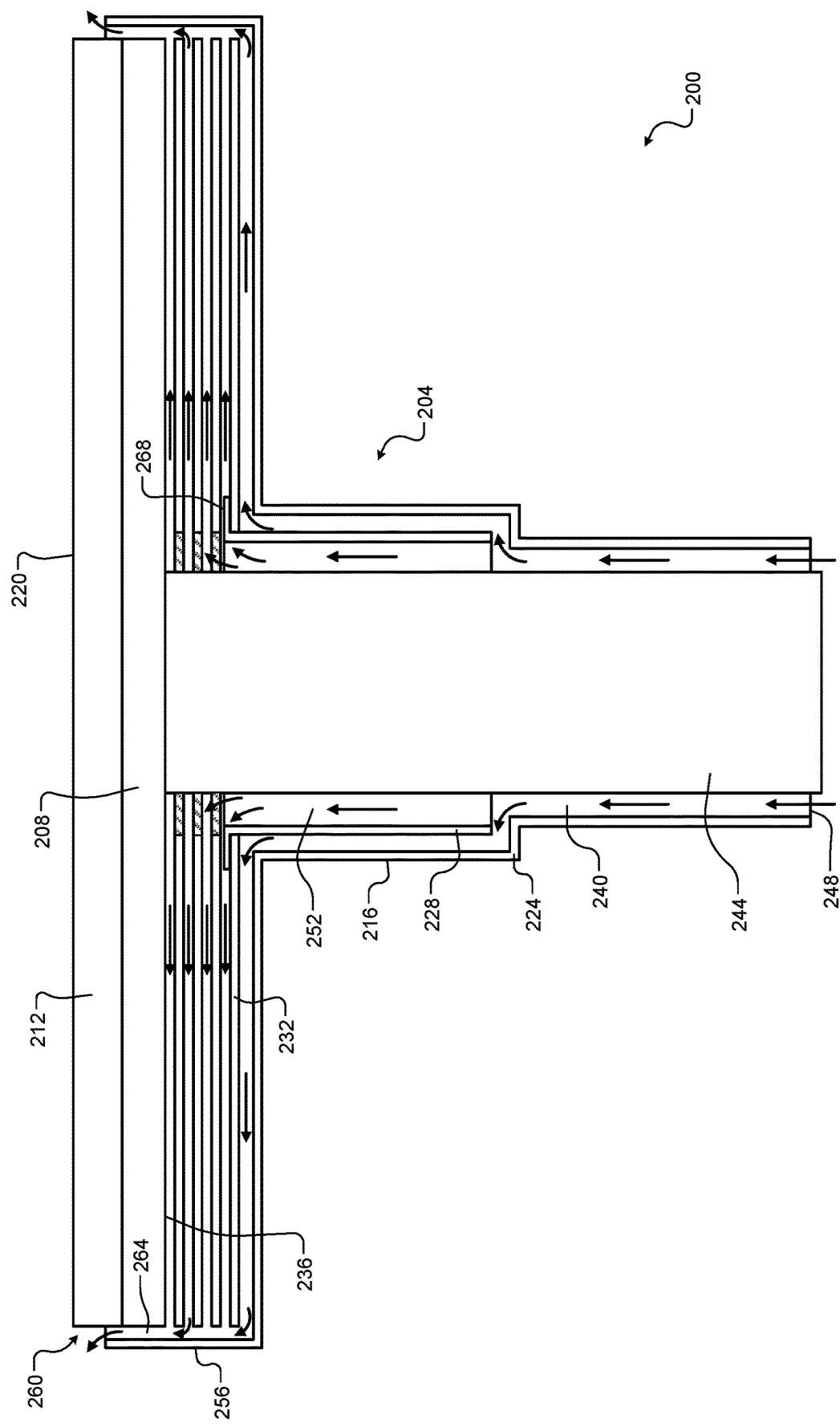
FIG. 2A is an example of a pedestal for supporting a substrate during a deposition process according to the present disclosure.
Figure 2B:
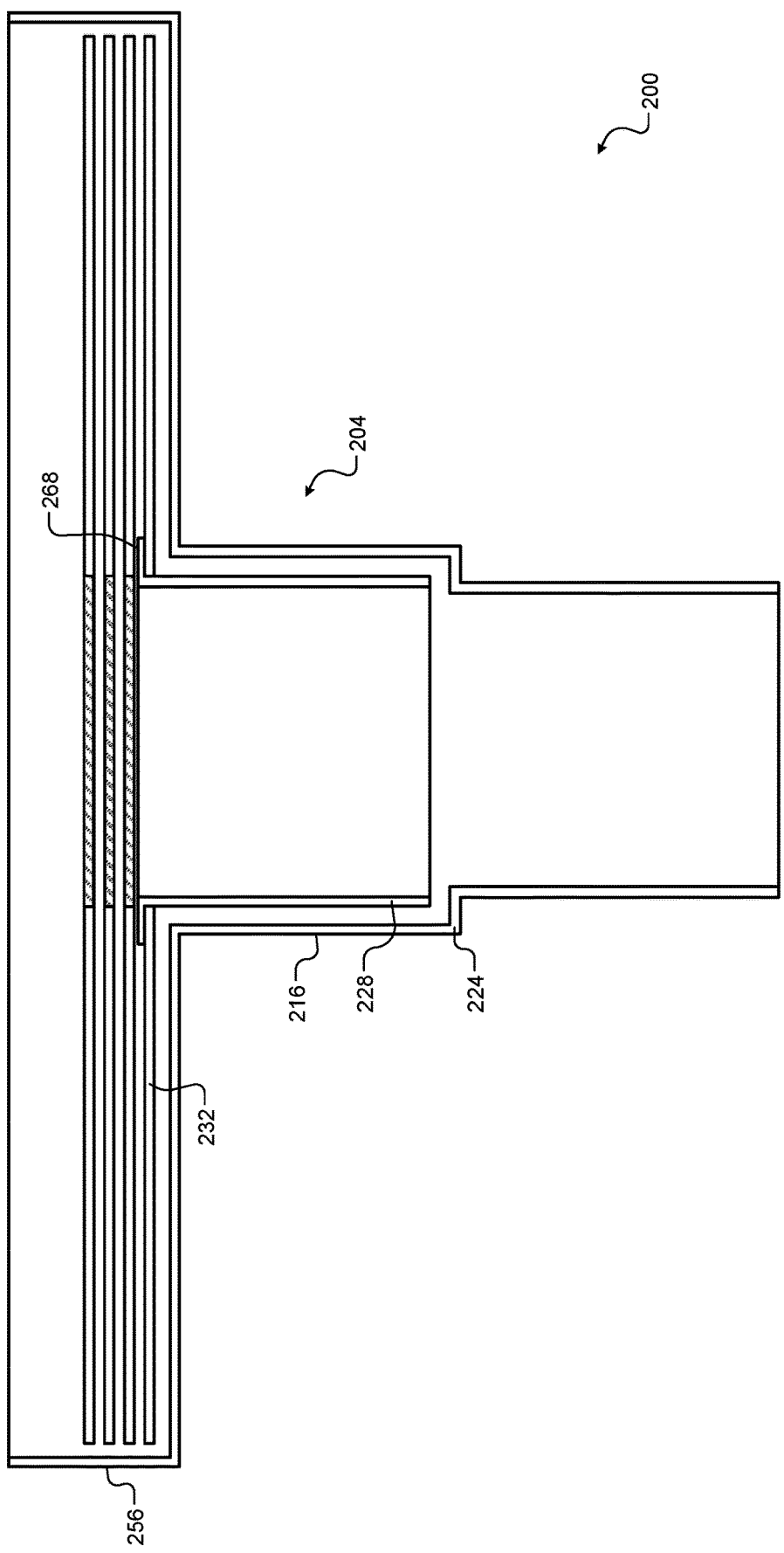
FIG. 2B is an example of a heat shield structure for a pedestal according to the present disclosure.

Referring now to FIGS. 2A and 2B, an example of a substrate support 200 including a heat shield structure 204 according to the present disclosure is shown. In FIG. 2A, the heat shield structure 204 is shown arranged on the substrate support 200. In FIG. 2B, the heat shield structure 204 is shown without the substrate support 200 for simplicity.

The substrate support 200 includes a baseplate (e.g., a conductive baseplate, such as aluminum, which may include coolant channels 164 as described above in FIG. 1) 208 and a ceramic layer 212. In some examples, the ceramic layer 212 may be selectively heated (e.g., using resistive heaters 160 as described above in FIG. 1). During processing such as CVD and ALD deposition, temperatures within the processing chamber 108 and, accordingly, temperatures of surfaces within the processing chamber 108 (e.g., surfaces of the substrate support 200) increase significantly. For example, various surfaces within the processing chamber 108 and on the substrate support 200 may increase to between 300 and 500° C. The heat shield structure 204 is arranged such that temperatures on an outer surface 216 of the heat shield structure 204 are significantly reduced. For example, temperatures on the outer surface 216 of the heat shield structure 204 may be less than 300° C. (e.g., between 200 and 285° C.) during deposition processing. Deposition rates of tungsten decrease exponentially below 300° C. In some examples, the heat shield structure 204 reduces temperature non-uniformities on an upper surface 220 of the ceramic layer 212.

The heat shield structure 204 includes an outer shield 224 (which includes the outer surface 216), a radial inner shield 228, and one or more heat shield plates 232 arranged between the outer shield 224 and a lower surface 236 of the substrate support 200. An inner volume 240 is defined between the outer shield 224 and portions of a stem 244 of the substrate support 200, the inner shield 228, and the lower surface 236 of the substrate support 200. The heat shield plates 232 encircle the stem 244 and are arranged between the lower surface 236 of the substrate support 200 and the outer shield 224. Accordingly, the heat shield plates 232 function as a heat radiation barrier between the lower surface 236 of the substrate support 200 and the outer shield 224, which reduces the temperature of the outer surface 216 of the outer shield 224. In other words, the heat shield plates 232 reduce the transfer of heat from the lower surface 236 of the substrate support 200 to the outer shield 224. The inner shield 228 prevents the transfer of heat from the outer shield 224 to the stem 244. The outer shield 224, the inner shield 228, and the heat shield plates 232 may be comprised of aluminum.

An inert gas (e.g., Argon) may be provided to the inner volume 240. For example, the inert gas may be flowed into the inner volume 240 from the gas delivery system 120 via one or more inlets 248. The inert gas flows upward between the outer shield 224 and between the stem 244 and the inner shield 228 and outward between the outer shield 224 and the heat shield plates 232. The inert gas may also flow upward in an inner volume 252 defined between the inner shield 228 and the stem 244. The inert gas flows out of the inner volume 252 between adjacent ones of the head shield plates 232.

The outer shield 224 includes an annular edge guard 256 that extends upward from the outer shield 224 around an outer perimeter 260 of the substrate support 200. For example, the edge guard 256 at least partially overlaps the baseplate 208 and the ceramic layer 212 to protect the outer perimeter 260 of the substrate support 200 corresponding to the baseplate 208 and the ceramic layer 212. The edge guard 256 defines a gap (e.g., a vertical gap) 264 between the outer shield 224 and the outer perimeter 260 of the substrate support 200 to prevent direct contact between the outer shield 224 and the substrate support 200. Accordingly, the transfer of heat from the outer shield 224 to the substrate support 200 is further minimized. Further, the inert gas flowed into the inner volume 240 exits via the gap 264, which provides a purge flow of gas to prevent process materials from entering the inner volume 240. The flow of the inert gas is indicated by arrows in FIG. 2A. In this manner, deposition of material (e.g., tungsten) on surfaces of the substrate support 200, the stem 244, etc. within the inner volume 240 is prevented.

The inner shield 228 includes an annular outer lip 268 that extends radially outward from the inner shield 228. The annular outer lip 268 overlaps a lowest one of the heat shield plates 232 and the inner shield 228 extends downward within the outer shield 224. Accordingly, the heat shield plate 232 supports the inner shield 228 and the inner shield 228 is not in direct thermal (i.e., physical) contact with the stem 244.

Referring now to FIGS. 3A, 3B, 3C, and 3D, example components of the heat shield structure 204 are described in more detail. In FIG. 3A, a portion 300 of the heat shield structure 204 includes an outer shield portion 304 including an edge guard 308 and heat shield plates 312. The heat shield plates 312 are supported on the outer shield portion 304 and a respective lower one of the heat shield plates 312 using insulator pins 316. An example of the insulator pins 316 is shown in more detail in FIG. 3B. The insulator pins 316 include a center disc portion 320 configured to maintain uniform spacing between adjacent heat shield plates 312 and pin portions 324 configured to be received within respective holes 328 in the heat shield plates 312 as shown in FIG. 3C. The insulator pins 316 are comprised of an insulative material (e.g., ceramic). Accordingly, the heat shield plates 312 are not in direct thermal contact with any of the outer shield portion 304, the substrate support 200, and each other. Further, a radius of a central opening 332 in the heat shield plates 312 is larger than a radius of the stem 244. Accordingly, the heat shield plates 312 are not in direct thermal contact with the stem 244.

As shown in FIG. 3D, a radial inner shield 336 includes an annular outer lip 340 that extends radially outward from the inner shield 336. The annular outer lip 340 overlaps a lowest one of the heat shield plates 312 and a main body 344 extends downward through the central opening 332 of the heat shield plate 312.

Figure 4A:
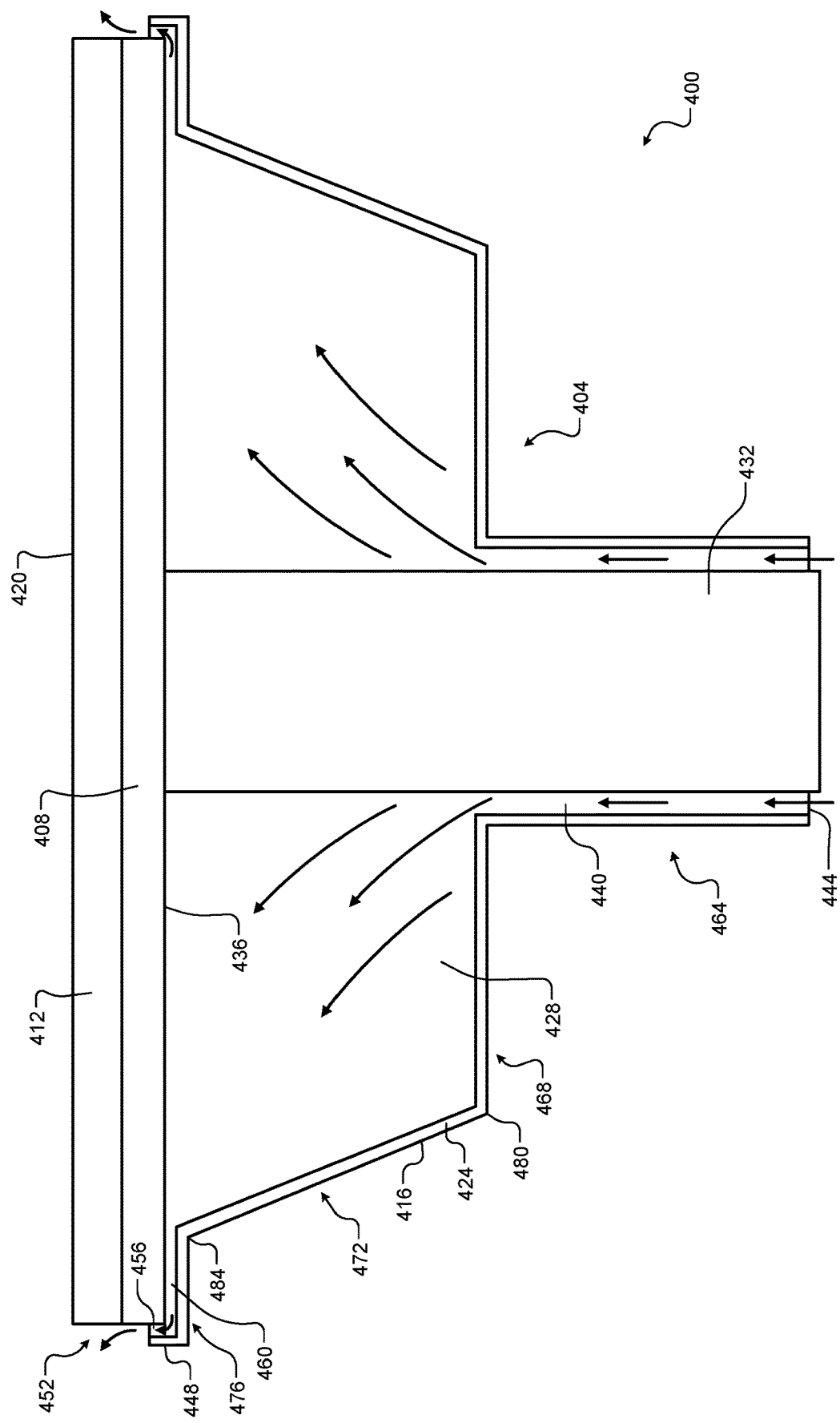
FIG. 4A is a pedestal including another example heat shield structure according to the present disclosure.

Referring now to FIGS. 4A and 4B, another example of a substrate support 400 including a heat shield structure 404 according to the present disclosure is shown. In FIG. 4A, the heat shield structure 404 is shown arranged on the substrate support 400. In FIG. 4B, the heat shield structure 404 is shown without the substrate support 400 for simplicity.

The substrate support 400 includes a baseplate 408 and a ceramic layer 412. In some examples, the ceramic layer 412 may be selectively heated. The heat shield structure 404 is arranged such that temperatures on an outer surface 416 of the heat shield structure 404 are significantly reduced in a manner similar to that described above in FIGS. 2A and 2B, and may reduce temperature non-uniformities on an upper surface 420 of the ceramic layer 412. In this example, in contrast to the example of FIGS. 2A and 2B, the heat shield structure 404 includes an outer shield 424 (which includes the outer surface 416 and may be comprised of aluminum) but does not include the radial inner shield 228 and the heat shield plates 232. However, in some examples, the heat shield structure 404 of FIGS. 4A and 4B may be combined with one or more of a radial inner shield and heat shield plates.

An inner volume 428 is defined between the outer shield 424 and a stem 432 and a lower surface 436 of the substrate support 400. An annular channel 440 (e.g., a vertical annular channel) is defined between the outer shield 424 and a lower portion of the stem 432. The inner volume 428 reduces the transfer of heat from the lower surface 436 of the substrate support 400 to the outer shield 424, which reduces the temperature of the outer surface 416 of the outer shield 424.

An inert gas (e.g., Argon) may be provided to the inner volume 428 via the annular channel 440, which encircles the lower portion of the stem 432. For example, the inert gas may be flowed into the annular channel 440 from the gas delivery system 120 via one or more inlets 444. The inert gas flows upward between the outer shield 424 and the stem 432 and into the inner volume 428.

The outer shield 424 includes an annular edge guard 448 that extends upward from the outer shield 424 around an outer perimeter 452 of the substrate support 400. For example, the edge guard 448 at least partially overlaps the baseplate 408 to protect the outer perimeter 452 of the substrate support 400. The edge guard 448 defines a gap (e.g., a vertical gap) 456 between the outer shield 424 and the outer perimeter 452 of the substrate support 400 to prevent direct contact between the outer shield 424 and the substrate support 400. Accordingly, the transfer of heat from the outer shield 424 to the substrate support 400 is further minimized.

The inert gas supplied to the inner volume 428 exits the inner volume 428 via a lateral channel 460 and the gap 456, which provides a purge flow of gas to prevent process materials from entering the inner volume 428. For example only, widths of the gap 456 and the lateral channel 460 are between 1 and 10 mm. The widths of the gap 456 and the lateral channel 460 may be the same or different. The upward and outward flow of the gas from the gap 456 also prevents accumulation of deposition material at the outer perimeter 452 of the substrate support 400. The flow of the inert gas is indicated by arrows in FIG. 4A. In this manner, deposition of material (e.g., tungsten) on surfaces of the substrate support 400, the stem 432, etc. within the inner volume 428 and on the baseplate 408 and the ceramic layer 412 at the outer perimeter 452 is prevented.

The outer shield 424 includes a generally vertical, cylindrical portion 464 defining the annular channel 440 between the outer shield 424 and the lower portion of the stem 432. A first lateral portion 468, an angled portion 472, and a second lateral portion 476 extend radially outward from the cylindrical portion 464 to the edge guard 448. For example only, the outer shield 424 transitions from the first lateral portion 468 to the angled portion 472 at a point 480 located between 50% and 75% of a distance between the stem 432 and the outer perimeter 452. In other words, a length of the first lateral portion 468 is between 50% and 75% of a distance between the stem 432 and the outer perimeter 452. An angle of the angled portion 472 relative to the first lateral portion 468 is between 95 and 135 degrees.

The angled portion 472 extends from the point 480 to a point 484 where the outer shield 424 transitions from the angled portion 472 to the second lateral portion 476. For example only, the distance from the point 484 and the outer perimeter 452 is at least 10% and less than 25% of an overall distance between the outer perimeter 452 and the stem 432 to define a minimum length of the lateral channel 460. The minimum length of the lateral channel 460 increases the rate and pressure of the gases flowing out of the inner volume 428.

Referring now to FIGS. 5A and 5B, another example substrate support 500 including a heat shield structure 504 according to the present disclosure is shown. In FIG. 5A, the heat shield structure 504 is shown arranged on the substrate support 500. In FIG. 5B, the heat shield structure 504 is shown without the substrate support 500 for simplicity.

The substrate support 500 includes a baseplate 508 and a ceramic layer 512. The ceramic layer 512 may be selectively heated. The heat shield structure 504 is arranged such that temperatures on an outer surface 516 of the heat shield structure 504 are significantly reduced in a manner similar to that described above in FIGS. 2A and 2B, and may reduce temperature non-uniformities on an upper surface 520 of the ceramic layer 512. In this example, the heat shield structure 504 includes an outer shield 524 (which includes the outer surface 516 and may be comprised of aluminum).

An inner volume 528 is defined between the outer shield 524 and a stem 532 and a lower surface 536 of the substrate support 500. An annular channel 540 (e.g., a vertical annular channel) is defined between the outer shield 524 and the stem 532. The inner volume 528 reduces the transfer of heat from the lower surface 536 of the substrate support 500 to the outer shield 524, which reduces the temperature of the outer surface 516 of the outer shield 524.

An inert gas (e.g., Argon) may be provided to the inner volume 528 via the annular channel 540, which encircles the lower portion of the stem 532. For example, the inert gas may be flowed into the annular channel 540 from the gas delivery system 120 via one or more inlets 544. The inert gas flows upward between the outer shield 524 and the stem 532 and into the inner volume 528.

In some examples, the outer shield 524 may include an annular edge guard 548 that extends upward from the outer shield 524 around an outer perimeter 552 of the substrate support 500. For example, the edge guard 548 at least partially overlaps the baseplate 508 to protect the outer perimeter 552 of the substrate support 500. The edge guard 548 defines a gap (e.g., a vertical gap) 556 between the outer shield 524 and the outer perimeter 552 of the substrate support 500 to prevent direct contact between the outer shield 524 and the substrate support 500. Accordingly, the transfer of heat from the outer shield 524 to the substrate support 500 is further minimized.

The inert gas supplied to the inner volume 528 exits the inner volume 528 via a lateral channel 560 and the gap 556, which provides a purge flow of gas to prevent process materials from entering the inner volume 528. For example only, widths of the gap 556 and the lateral channel 560 are between 1 and 10 mm. The widths of the gap 556 and the lateral channel 560 may be the same or different. The upward and outward flow of the gas from the gap 556 also prevents accumulation of deposition material at the outer perimeter 552 of the substrate support 500. The flow of the inert gas is indicated by arrows in FIG. 5A. In this manner, deposition of material (e.g., tungsten) on surfaces of the substrate support 500, the stem 532, etc. within the inner volume 528 and on the baseplate 508 and the ceramic layer 512 at the outer perimeter 552 is prevented.

As shown, the outer shield 524 may be comprised of multiple (e.g, two) sections. For example, the outer shield 524 may include a vertically-oriented stem section 564 and a horizontally-oriented plate section 568. The stem section 564 surrounds the stem 532. An upper end of the stem section 564 supports the plate section 568. For example, an inner diameter 572 defining an inner opening of the plate section 568 may be arranged on an annular ledge 576 defining an outer diameter of the upper end of the stem section 564.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A heat shield structure for a substrate support in a substrate processing system, the heat shield structure comprising:
    an outer shield configured to surround a stem of the substrate support, wherein the outer shield is further configured to define (i) an inner volume between the outer shield and an upper portion of the stem and a lower surface of the substrate support and (ii) a vertical channel between the outer shield and a lower portion of the stem of the substrate support, wherein the outer shield includes
        a cylindrical portion,
        a first lateral portion extending radially outward from the cylindrical portion,
        an angled portion extending radially outward and upward from the first lateral portion, and
        a second lateral portion extending radially outward from the angled portion,
    wherein a length of the first lateral portion is between 50% and 70% of a distance between the stem of the substrate support and the outer perimeter of the substrate support, and
    wherein a length of the second lateral portion is between 10% and 25% of the distance between the stem of the substrate support and the outer perimeter of the substrate support.

2. The heat shield structure of claim 1, further comprising an edge guard extending upward from the second lateral portion of the outer shield, wherein the edge guard is configured to (i) surround an outer perimeter of the substrate support and (ii) define a gap between the edge guard and the substrate support.

3. The heat shield structure of claim 1, wherein the vertical channel is annular.

4. The heat shield structure of claim 1, wherein an angle of the angled portion relative to the first lateral portion is between 95 and 135 degrees.

5. The heat shield structure of claim 1, wherein the second lateral portion defines a lateral channel between the second lateral portion and the lower surface of the substrate support.

6. The heat shield structure of claim 5, wherein a width of the lateral channel is between 1 and 10 mm.

7. The heat shield structure of claim 2, wherein a width of the gap is between 1 and 10 mm.

8. The heat shield structure of claim 1, wherein the outer shield is not in direct contact with either one of the stem and the lower surface of the substrate support.

9. A substrate support comprising the heat shield structure of claim 1, wherein the substrate support corresponds to a pedestal configured to support a substrate during at least one of chemical vapor deposition and atomic layer deposition.

10. A system comprising the heat shield structure of claim 1, the system further comprising a gas source configured to flow a purge gas into the inner volume via the vertical channel.

* * * * *